United States Patent [19]

Conroy-Wass et al.

[11] Patent Number: 5,339,221
[45] Date of Patent: Aug. 16, 1994

[54] PRINTED CIRCUIT BOARD MOUNTING CAGE

[75] Inventors: Theodore R. Conroy-Wass, Tustin; Peter W. Moore, Rossmoor, both of Calif.

[73] Assignee: Hughes Aircraft Company, Los Angeles, Calif.

[21] Appl. No.: 923,201

[22] Filed: Jul. 31, 1992

[51] Int. Cl.⁵ .............................................. H05K 7/14
[52] U.S. Cl. ..................... 361/796; 439/65; 361/784
[58] Field of Search ............... 361/784, 785, 792, 796, 361/728, 730, 736, 752; 439/59, 61, 62, 65, 74

[56] References Cited

U.S. PATENT DOCUMENTS 4,888,549 12/1989 Wilson et al. ..................... 361/796
5,218,519  6/1993 Welch et al. ..................... 361/796

Primary Examiner—Leo P. Picard
Assistant Examiner—Bot Ledynh
Attorney, Agent, or Firm—Elizabeth E. Leitereg; T. Gudmestad; W. K. Denson-Low

[57] ABSTRACT

A rectangular cage formed of near identical grooved support panels (290,292,294,296) slidably mounts horizontal and vertical stacks of circuit boards and circuit board frame assemblies (280,282), with each board of one stack connected to some or all boards of the other stack in edge to edge relation. The cage is open at both front and rear to slidably receive the circuit board frame assemblies that are latched in place by a lever (208) operated cam (210) arrangement on each board frame that engages pairs of latch rods (218) on front and rear edges of the support panels. The support panels are apertured (302,304) to allow air to be blown over the circuit boards and two of the panels (290,292) carry mid-plane terminating panels (342,330) for support of cable connector sockets (38).

12 Claims, 15 Drawing Sheets

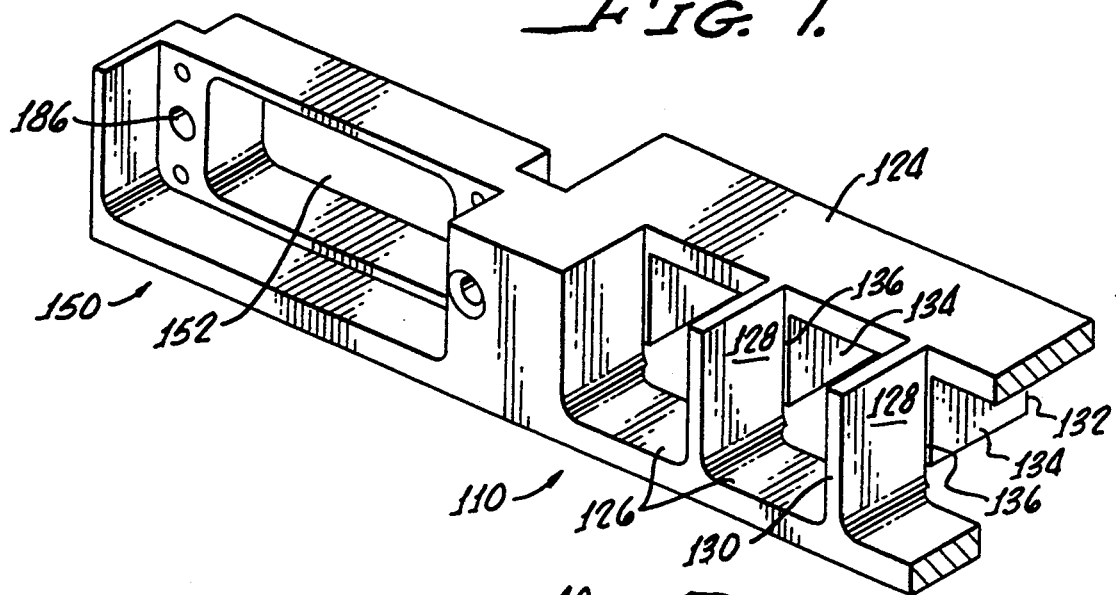
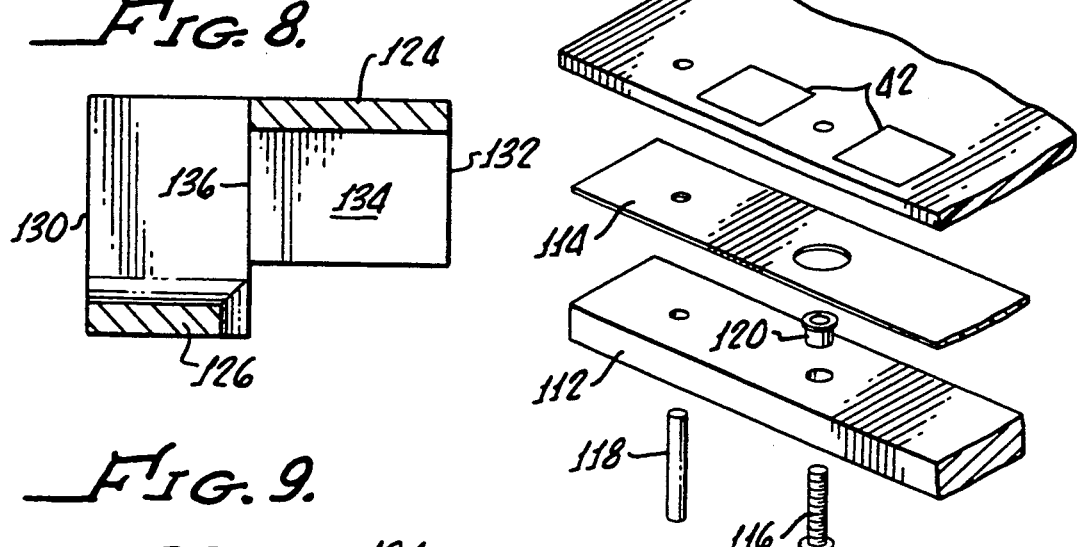
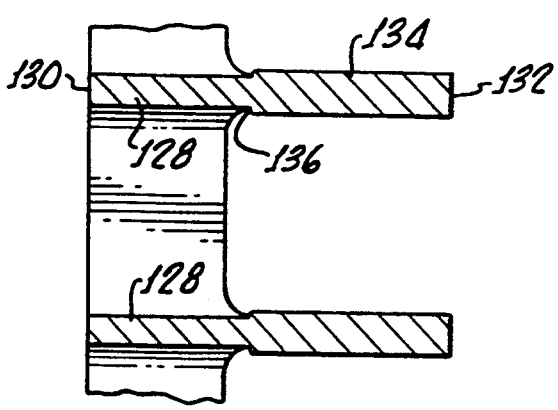

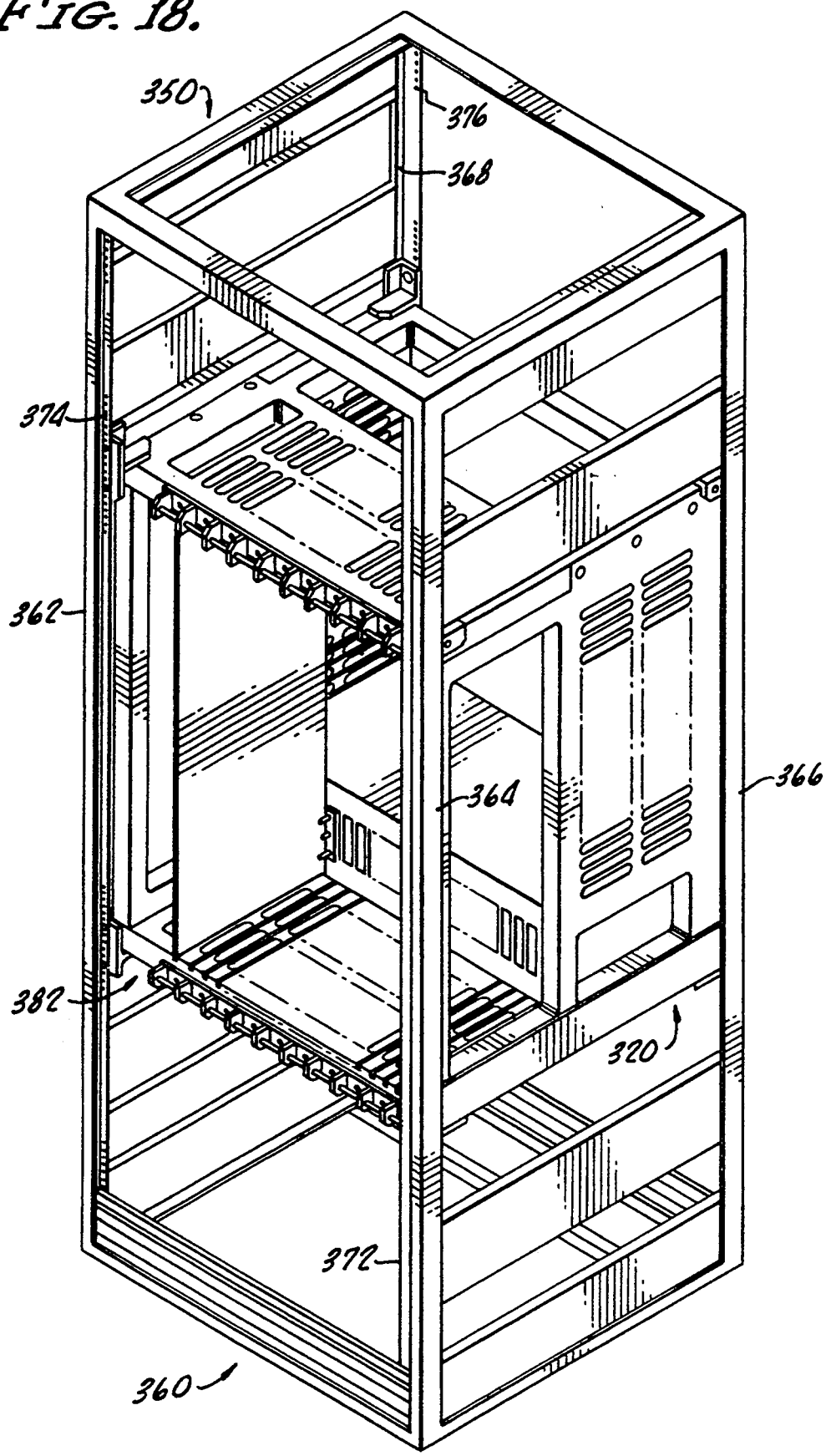

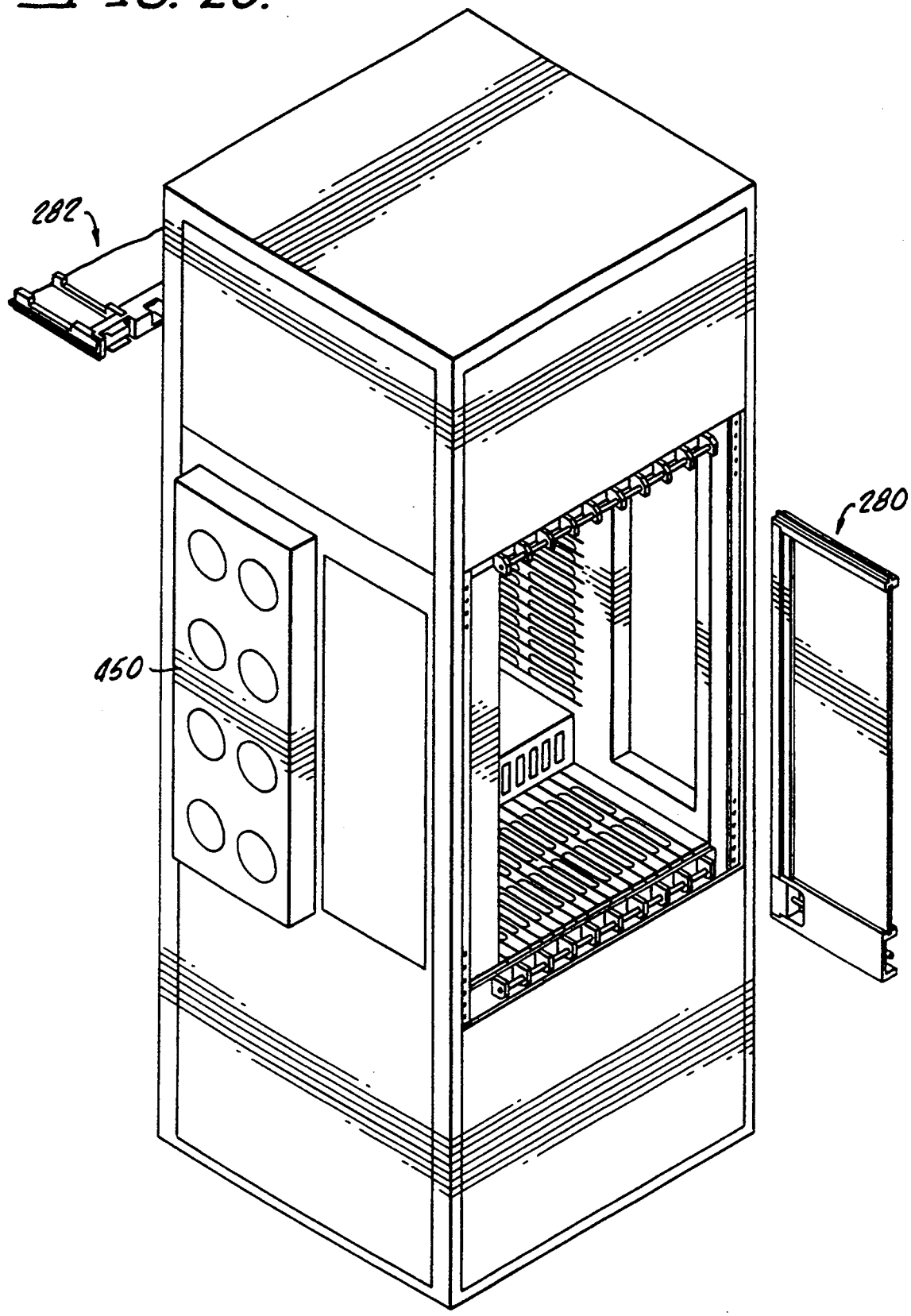

PRINTED CIRCUIT BOARD MOUNTING CAGE

This application is related to the following U.S. Patent Applications all filed concurrently herewith, the disclosures of which are incorporated herein as though fully set forth: Double Ended Hermaphroditic Signal Node Module Assembly, Ser. No. 07/922,909, filed Jul. 31, 1992; Printed Circuit Board Frame Module Assembly, Ser. No. 07/923,415, filed Jul. 31, 1992; Multimodule Terminating Plane Assembly, Ser. No. 07/923,189 filed Jul. 31, 1992; and Sequential Mating of Connectors of Multiple Framed Circuit Board Assembly, Ser. No. 07/922,905, filed Jul. 31, 1992. All of these applications are assigned to the assignee of the present application.

BACKGROUND OF THE INVENTION

1. Field of the Invention

The present invention relates to mounting of printed circuit board assemblies and more particularly concerns a supporting cage for edge connected stacks of printed circuit board and frame assemblies that facilitates direct edge to edge connection of two stacks of boards and frames in mutually perpendicular planes.

2. Description of Related Art

As functions and operations of electronic equipment expand in scope and complexity, greater amounts of circuitry are necessarily employed. Circuit boards become larger and increased numbers of such boards are used. For example, very large capacity computers which embody massive parallel processing of data and massive parallel computational operations and some telephone switching circuits for distribution of video and information systems for household use may employ large numbers of identical or nearly identical circuits. Often, groups of similar or identical circuits are mounted on each of a large number of circuit boards that are packaged in a group. In a common type of multi board packaging arrangement, boards of a first group of mutually parallel daughter boards are positioned in parallel planes that are perpendicular to one side of a mother board, and a second group of such parallel daughter boards lie in planes perpendicular to the opposite side of the mother board. System operation requires the ability to interconnect circuits on one daughter board to circuits on another daughter board. The mother board is provided to afford such interconnections. Thus, a circuit on one daughter board is connected to a circuit on a second daughter board by a connection between the first daughter board and the mother board, appropriate circuitry in the mother board, and a connection between circuitry of the mother board and the second daughter board. Such arrangements require complex and costly termination processes and hardware for interconnection of the daughter boards to the mother board. Importantly, length and impedance of the circuit path between the two interconnected daughter boards varies depending upon the location of the daughter boards with respect to one another and with respect to the interposed mother board. The path length of the connection between two daughter boards depends to a large extent upon the length of the interconnection path that is provided within the interposed mother board itself. Such varying path lengths introduce varying impedance and varying timing, so that it may be necessary in some cases to introduce compensating timing circuits that account for differences in the time required for signals to traverse different ones of the circuit paths that interconnect daughter boards. Further, such daughter boards often carry electrical power and fiber optic input/output connectors on back edges, requiring various connections to be made to the board at locations widely separated on the board from the electrical data signal connectors. Moreover, the required use of the interposed mother and its circuits adds further to cost and complexity of the assembly.

To avoid problems such as these it has been suggested, as set forth in the co-pending patent application of Felix M. Oshita, Ronald L. Campbell and Theodore R. Conroy-Wass for Hermaphroditic Interconnection of Circuit Boards, Ser. No. 07/801,977, Filed Dec. 3, 1991 and assigned to the assignee of the present application, board edges are provided with hermaphroditic connector nodes to enable the daughter boards to be connected directly to one another in an edge to edge relation. Such a configuration provides significant advantages in the compact interconnection of large numbers of circuit boards. However, it is necessary to provide a support structure for two stacks of boards that optimizes advantages derived from the edge to edge hermaphroditic interconnection of stacks of boards.

Therefore, it is an object of the present invention to provide a cage for mounting stacks of circuit board that is specifically designed for use in a system wherein two stacks of circuit boards are interconnected in edge to edge relation.

SUMMARY OF THE INVENTION

In carrying out principles of the present invention in accordance with a preferred embodiment thereof, a mounting cage for supporting a plurality of circuit board frame module assemblies comprises first and second pairs of mutually parallel and mutually spaced support panels, each of said pairs of panels extending between and fixedly interconnecting panels of the other of said pairs to define a rigid cage having a front opening framed by front edges of the panels and a rear opening framed by rear edges of said pairs. Panels of said first pair each includes circuit board receiving guideways forming mutually opposed and aligned pairs of guideways, each pair of said guideways being configured and arranged to receive opposite edges of a circuit board. The guideways of said first pair of panels extend from said front edges toward said rear edges, and the guideways of the second pair of panels extend from the rear edge thereof toward said front edges. The cage carries mid-plane terminal panels bearing cable connector sockets and has its panels apertured for blowing air over stacks of circuit boards. Two stacks of printed circuit board frame module assemblies are mounted in the cage by slidable reception of guide ribs of the frame module assemblies in sets of parallel guideways formed in facing surfaces of cage support panels.

BRIEF DESCRIPTION OF THE DRAWINGS

In the accompanying drawings:

FIG. 7 is a fragmentary exploded pictorial view of the connector node carrier and its clamping structure;

FIGS. 8 and 9 are sections of FIG. 7;

FIG. 18 illustrates the printed circuit board frame module assembly carrying cage mounted in a support rack;

FIG. 20 shows a view of the mounting rack having a fan housing mounted thereto.

DESCRIPTION OF THE PREFERRED EMBODIMENTS

Figure 1:
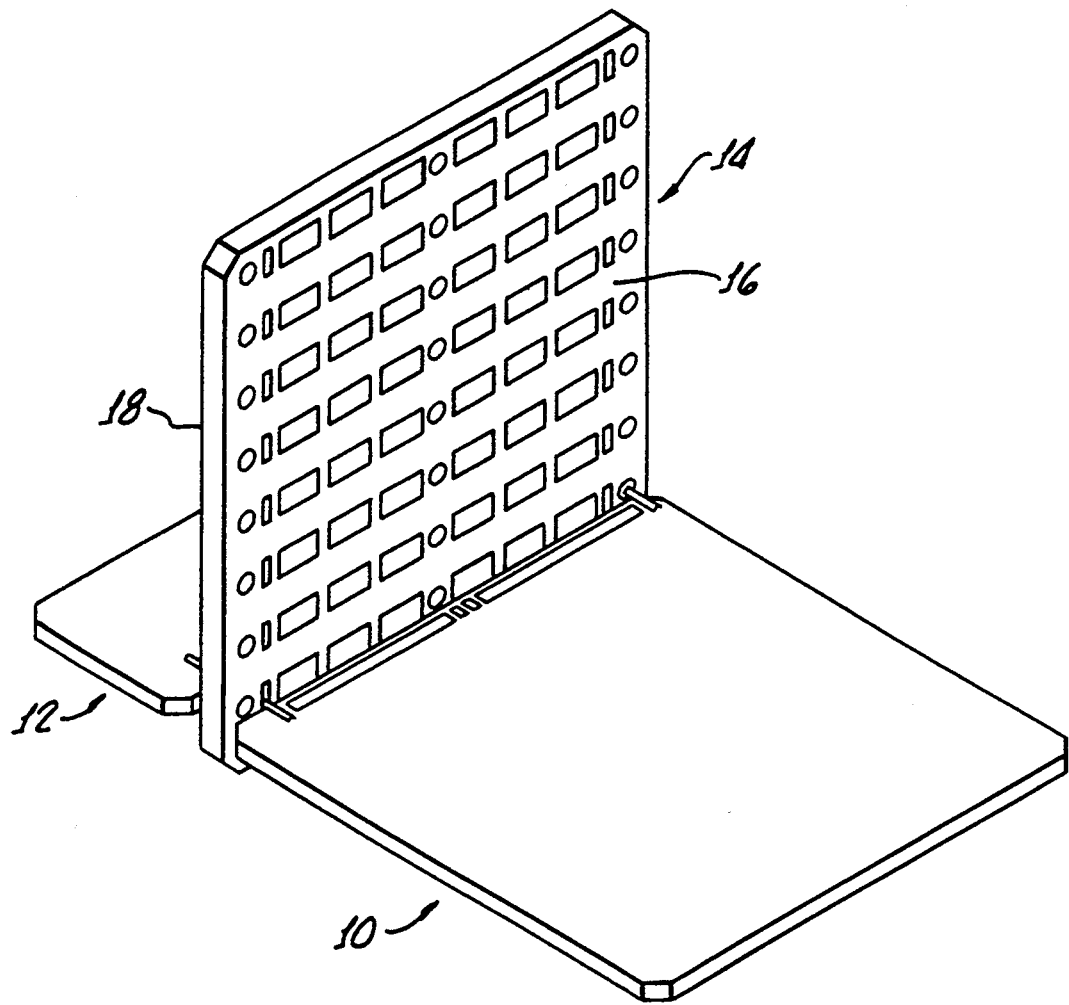
FIG. 1 illustrates a typical prior art arrangement of interconnection of daughter boards to one another through the intermediary of a mother board.

FIG. 1 shows an arrangement of the prior art in which a first group of daughter boards, generally indicated at 10, which may comprise as many as twenty or more mutually parallel and mutually spaced printed circuit boards, are connected to printed circuit boards of a second group, generally indicated at 12, which similarly consists of a large number of mutually parallel, mutually spaced boards. Interconnections of boards of one group to boards of the other group are made by means of a single interposed mother board 14. Boards of the first group 10 are positioned normal to a first surface of the mother board and have conventional electrical connection elements on their edges which connect to contacts on a first surface 16 of the mother board. Similarly, boards of the second group 12 have conventional electrical connection elements on their edges which connect to connecting elements on the opposite surface 18 of the mother board. A connecting circuit path from a board of a first group to a board of the second group goes from the edge connector of the board of the first group to the mother board, then through circuitry formed in the mother board and thence through the connection between the board of the second group and the other side of the mother board. The length of the circuit path of connecting circuits in the mother board varies according to which boards of one group are connected to which boards of the other group, and thus impedance and timing vary significantly from one interconnection to another.

Figure 2:
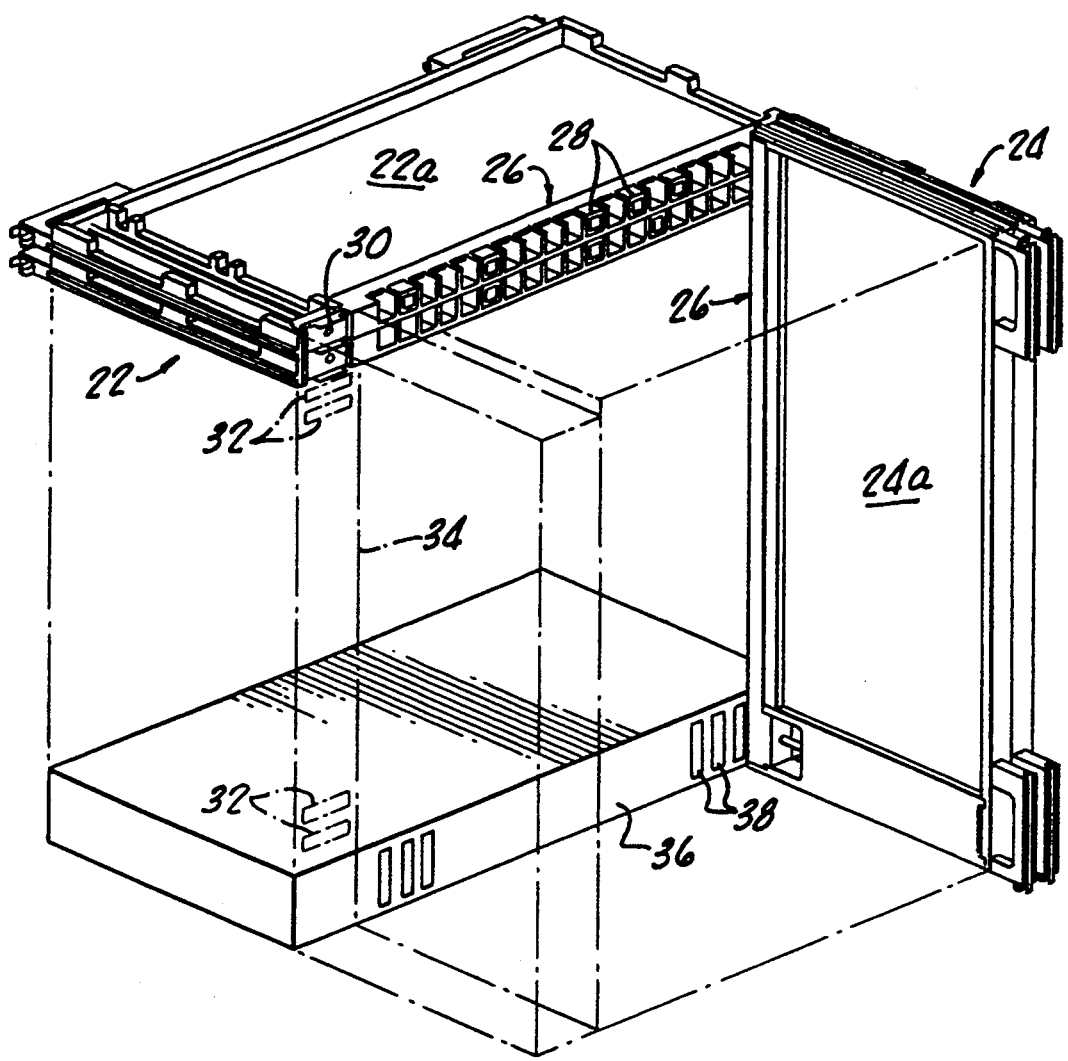
FIG. 2 schematically illustrates stacks of circuit boards and frame module assemblies interconnected in edge to edge relation and including service cable connections therefor.

To avoid certain problems of the prior art, two stacks of circuit boards are connected directly to one another, without an interposed mother board, as shown in FIG. 2. The present invention relates to a mounting cage for supporting stacks of circuit boards in the relation shown in FIG. 2.

FIG. 2 shows an arrangement of printed circuit board and frame module assemblies that may be supported in the cage (not shown in FIG. 2) of the present invention in a configuration that enables each board of a first group of daughter boards 22 to be connected directly in edge to edge relation to all boards of a second group of daughter boards 24. In order to afford a more complete understanding of the support cage of the present invention, there will first be described the printed circuit board frame module assemblies that the support cage is specifically designed to carry. Nevertheless, it will be understood that the support cage, to be described hereinafter, may be readily adapted to carry printed circuit board frame module assemblies of many different configurations.

Each printed circuit board (FIG. 2), such as board 22a,24a, is mounted in its own frame which has a node carrier 26 in which are mounted a plurality of data handling connector nodes 28 and a single service cable connector plug 154 (for boards 22a) and service cable connector plug 38 (for boards 24a). Service cables, including fiber optic input/output cables and power cables (FIG. 12) are connected to circuits of the individual printed circuit boards and terminate for each board in the service cable connector plug 154 that is positioned at one end of the node carrier 26 of the frame. Data and signal lines of the printed circuit board of the first group are coupled to the several edge connector nodes 28 for direct connection to corresponding data edge connector nodes on boards of the second group of boards 24. The arrangement enables each node of the set of connector nodes of one board of the first stack of boards to be connected to a corresponding connector node of different ones of the boards of the second stack. The single service module connector plug part 154 of each board is adapted to be connected to a service cable connector receptacle part 32 of a vertically extending array of receptacle parts carried by a service module mid-plane terminating panel 34 that is carried in the mounting cage (not shown in FIG. 2) in which both stacks 22 and 24 of circuit boards are to be finally mounted. FIG. 2 shows only the orientation and relative positions of the two stacks of interconnected boards and frames but does not show the external mounting cage structure, which will be described below and is shown in detail in FIGS. 14–21. Service cable receptacles 32, of the array of such receptacles, of the service module mid-plane terminating panel 34 are connected to the respective service connector plugs 154 of the individual circuit boards of the stack 22. Similarly, a second service module mid-plane terminating panel 36 carries an array of service module connector receptacle parts 38 for connection to each service module connector plug part of the boards of the board group 24. Each mid-plane terminating panel and all of the receptacle parts of its array form a unitary module that can be connected to and detached as a single unit from a cage (not shown in FIG. 2) in which all printed circuit boards are mounted.

PRINTED CIRCUIT BOARD FRAME MODULE ASSEMBLY

A circuit board frame houses the printed circuit board so that all of its data module connector nodes 28 and its single service cable connector part 154 are positioned at a single terminating plane for interface with a corresponding terminating plane of boards of the opposing group and with a service cable connector receptacle loosely mounted at the terminating plane.

Figure 3:
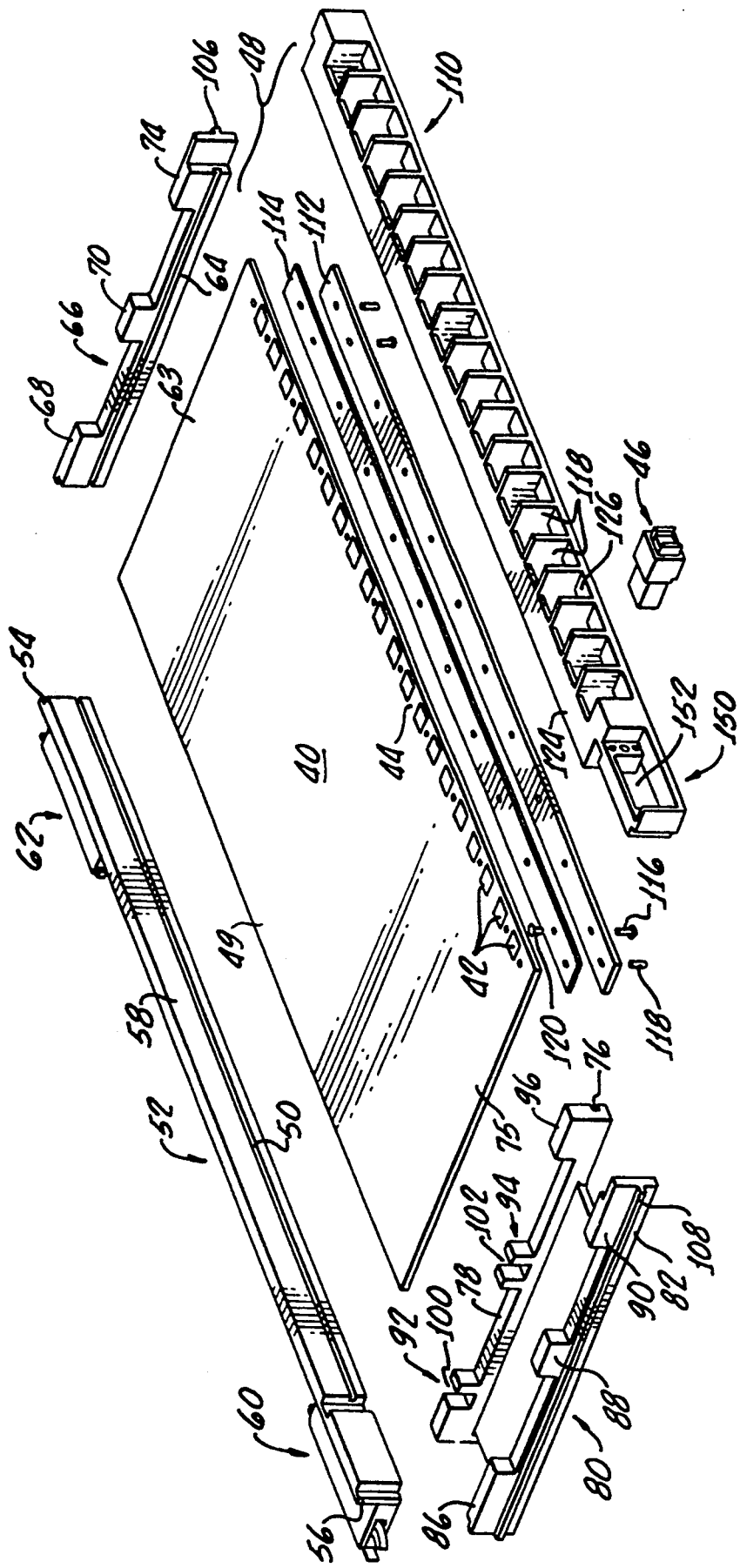
FIG. 3 is an exploded pictorial view of major components of a printed circuit board and frame module assembly of the type used with the present invention.
Figure 4:
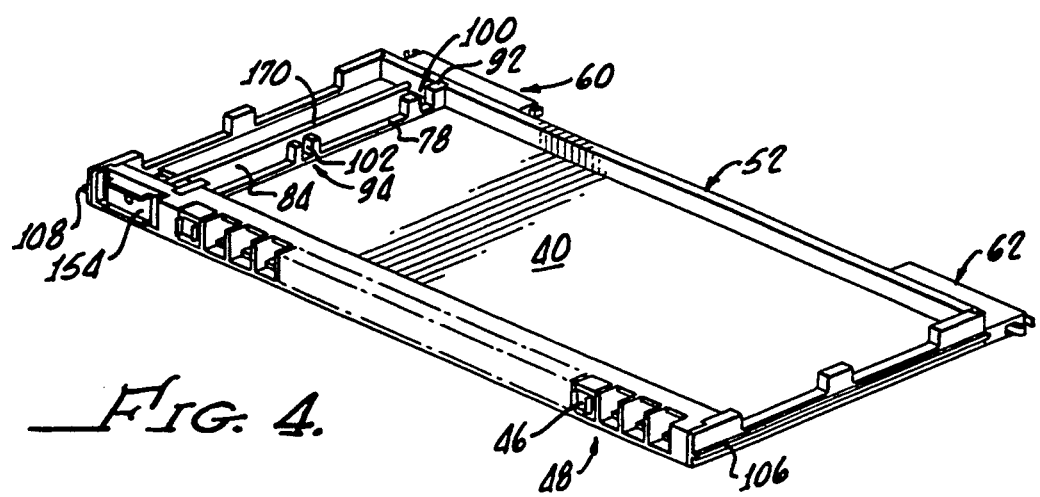
FIGS. 4 and 5 are pictorial illustrations looking at different sides of an assembled printed circuit board and frame module assembly.
Figure 5:
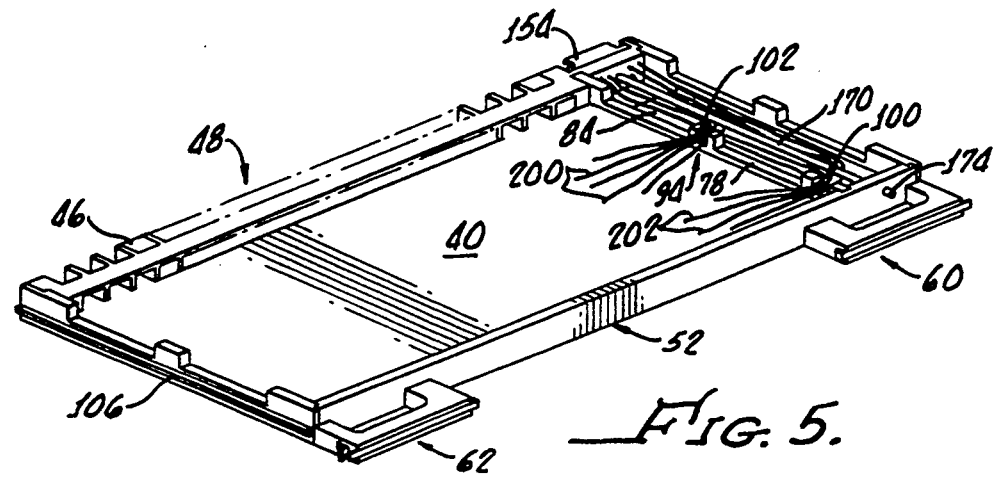

FIGS. 3,4 and 5 illustrate most of the major components of an assembly of a single printed circuit board and its supporting frame elements. A printed circuit board 40, having a plurality of circuits and/or electrical components (not shown) thereon is formed with a plurality of edge connector pads 42 aligned along a first edge 44 of the board. Each of the pads 42 includes a number of mutually spaced raised pressure type connectors (sometimes termed "dots"), each of which is adapted to be electrically and physically connected to an hermaphroditic edge connector node 46 of the type shown in detail in my co-pending application for Double Ended Hermaphroditic Signal Node Module Assembly filed Jul. 31, 1992, Ser. No. 07/922,909 (attorneys Docket PD-92203, 89-77-D). The circuit board frame includes the metal connector node carrier assembly 26 that is fixedly clamped to the forward edge 44 of the printed circuit board, as will be described in more detail below. The opposite rear edge 49 of the printed circuit board is received in a longitudinally extending groove 50 of a metal face plate 52, having rabbitted edges forming end flanges 54,56 on an elongated rigid body 58. Handles 60,62 are fixed to the face plate 52 and carry latching mechanisms, to be described in detail below. One side 63 of the circuit board is received in a longitudinally extending groove 64 of a guide rail 66, having mutually spaced upstanding projections 68,70 and 74 at the opposite ends and at an intermediate portion thereof, with projections 68 and 70 defining a first recess therebetween, and projections 70 and 74 defining a second recess therebetween. These recesses help to define paths for air flow flowing between closely stacked circuit boards for cooling purposes, as will be described below.

The other side 75 of the circuit board is loosely received in a longitudinally extending groove 76 formed in an inner guide rail 78 of an end channel guide rail 80. Thus the circuit board is loosely received in the three grooves 50,64,76, being fixed only at its front edge to the node carrier assembly. This floating arrangement allows the grooves, which are somewhat wider than the thickness of a board of minimum thickness, to accept boards of different thicknesses, and, moreover, relieves stress on the board (e.g. no load is applied to the board) when the frame is forced into its final position wherein connections for electrical power, fiber optic input/output signals, and electrical data signals are all operatively and forcibly engaged. Although rigidly clamped at its forward edge to carrier assembly 26, the circuit board is only loosely received in the several grooves of the two side rails and face plate. This enables the board to "float" in the side rails and face plate to minimize stress experienced by the board during insertion and to enable the frame to receive boards of differing thicknesses, up to a thickness nearly equal to the width of the board receiving grooves.

Figure 12:
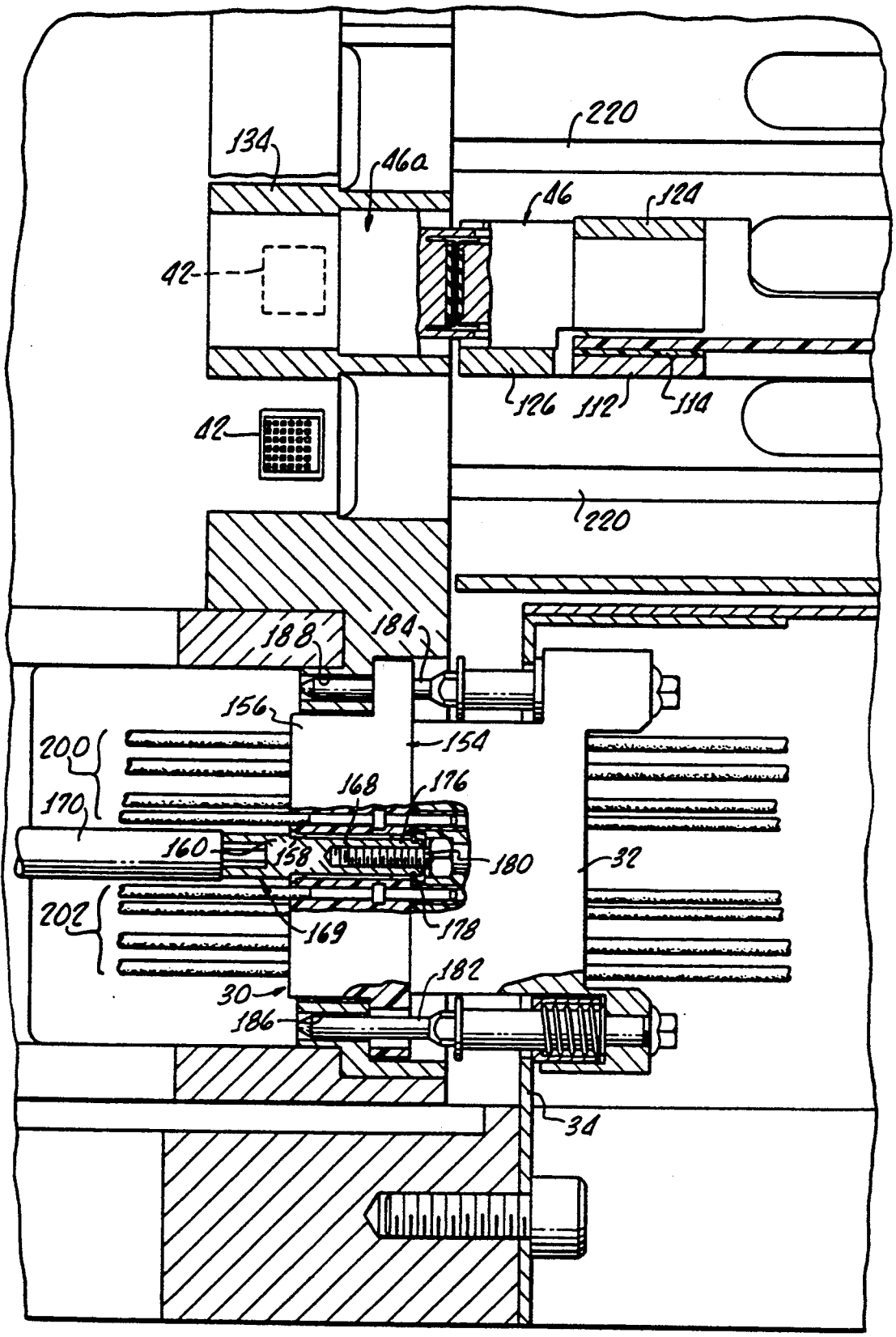
FIG. 12 shows portions of two interconnected circuit board and frame module assemblies, with parts broken away.

The end channel guide rail 80 includes the inner guide rail 78, and an outer guide rail 82 rigidly interconnected thereto by a web 84 to effectively form a shallow channel extending in a direction normal to the board edge 44 for receiving and guiding service cables, including electrical power and fiber optic input/output cables, as will be more particularly described below. Outer guide rail 82, like guide rail 66, is formed with a plurality of upstanding projections 86,88,90 at opposite ends and at an intermediate portion thereof to define cooling air flow channels aligned with the channels of guide rail 66. Similarly, inner guide rail 78 is formed with upstanding projections 92,94,96 aligned with the corresponding projections on the other guide rails to similarly form cooling air flow recesses and, in addition, to provide electrical power shielding for the boards. The projections 92 and 94 are bifurcated to provide notches 100 and 102 that receive and guide service cables (not shown in FIG. 3), including bundles of electrical power cables 200 and bundles of fiber optic input/output cables 202 (FIGS. 5 and 12). Suitable arrangements (not shown) for strain relief of electrical power and fiber optic cables are provided in the channeled side rail of the circuit board frame. Each of the outermost guide rails 66 and 80 is provided with an intermediate guide rib 106,108 (see also FIG. 6) that extends along the entire length of the guide rail, projecting laterally outwardly therefrom, to be slidably received in guide grooves of the mounting cage support panels, as will be described in detail below.

The node carrier housing assembly (see FIGS. 3, 7, 8, 9 and 12) includes a rigid, elongated metal carrier housing 110 that extends along the top (as viewed in FIG. 3) of circuit board 40, covering the connector pads 42, and a clamping structure, including a rigid clamping bar 112 and a Teflon strip 114, both positioned below the board edge. Strip 114 is positioned against the bottom of the circuit board 40, the side opposite the side that bears pads 42, and is clamped to the circuit board by the clamping bar 112. A plurality of screws 116 extend from the bottom of the assembly, through the clamping bar, through the Teflon strip, and through the circuit board into threaded engagement with threaded apertures in the carrier housing 110 on the top of the circuit board. This arrangement fixedly clamps the carrier housing rigidly to the edge of the circuit board. Alignment pins 118 extend through the clamping bar, Teflon strip and circuit board into the metal carrier housing to ensure initial alignment of the assembled parts. A metal grommet 120 is mounted on each of the securing screws 116 and contacts pads on the printed circuit board to provide ground connections from the clamping bar.

The carrier housing 110, as shown in further detail in FIGS. 7, 8 and 9, and as can be also seen in FIG. 12, includes a top wall 124 extending along substantially the entire length of only the rear portion of the housing, and a bottom wall 126, extending along only the front portion of the length of the housing, with a plurality of upstanding intermediate walls 128 dividing the length of the carrier housing into a plurality of three sided connector node receiving pockets. The walls 128 extend entirely from a front edge 130 to a back edge 132 of the carrier housing, being thicker throughout the rear section 134 of the divider wall. Thus the divider walls provide forward facing shoulders 136 on either side of the three-sided pockets formed between adjacent divider walls 128 and the carrier housing bottom wall 126.

Figure 13:
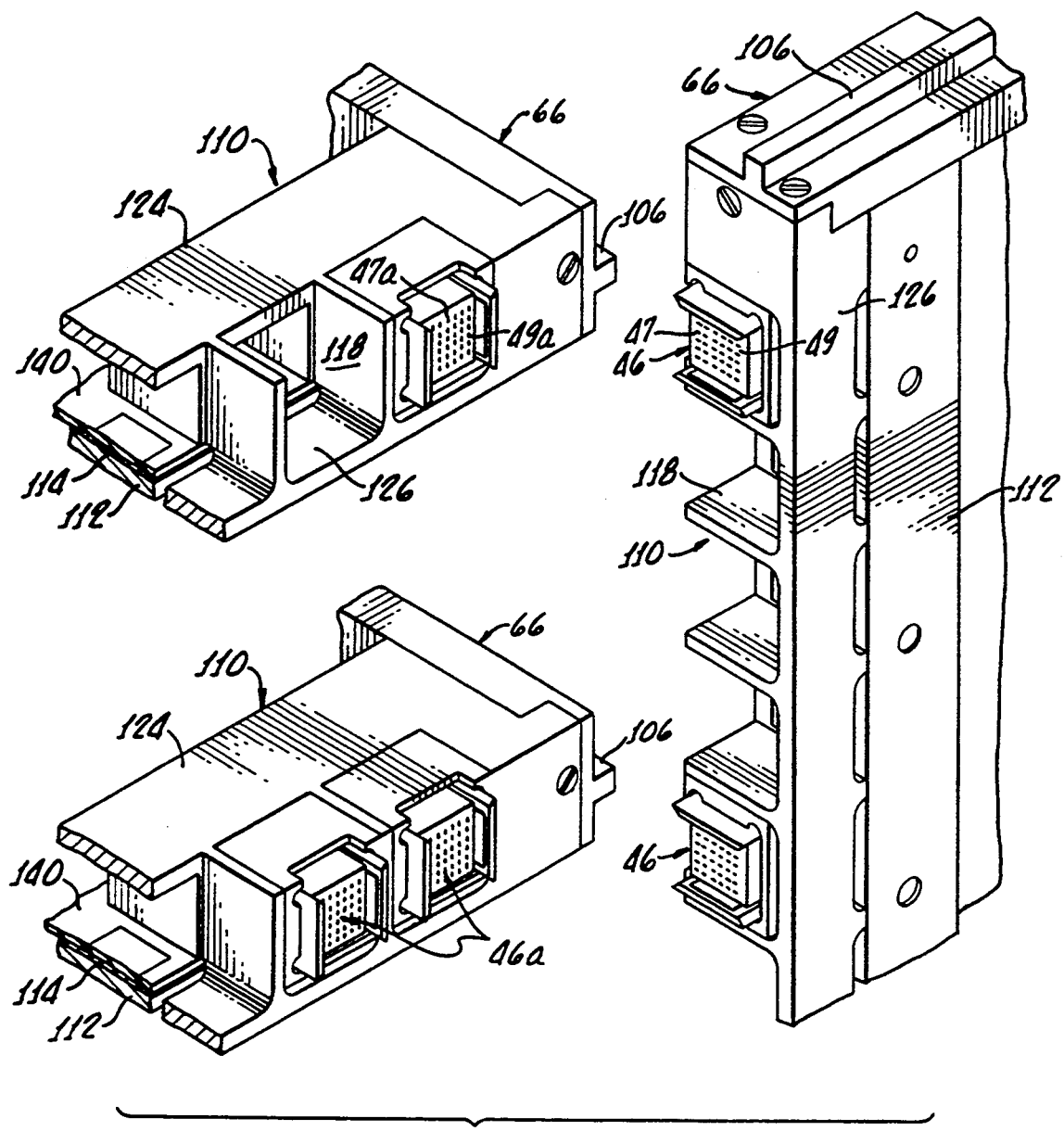
FIG. 13 is an exploded pictorial view illustrating edge to edge interconnection of hermaphroditic connector modules.

Each three-sided pocket of the metal carrier housing 110 is adapted to receive an individual one of a group of hermaphroditic edge connector nodes 46, of which one is shown detached from its carrier pocket in FIG. 3. Several pairs of such connector nodes 46,46a, each mounted in its carrier, are shown in FIG. 13 in exploded form, illustrating the manner in which the raised pressure contacts (dots) 49 on the face 47 of one node are arranged to bear against the raised pressure contacts 49a on the face 47a of the mating node. In FIG. 13 the nodes 46,46a are shown assembled to the respective carrier housings of boards that have been displaced from one another to show the interconnecting faces of the connector nodes. Assembled relation and interconnection of the connecting faces of pairs of such nodes are shown in FIG. 12. Each node has a first set of board connecting contacts on a side thereof that are in electrical contact with the pressure type connectors or dots on pads 42 when the node is mounted in a carrier that is clamped to the board edge. The board connecting contacts of each node are electrically connected within the node to raised pressure contacts (dots) such as dots 49,49a,46,46a (FIG. 13) on the end face of the node to provide the node to node contact for transfer of electrical data signals, as shown in FIG. 12, for example.

Figure 6:
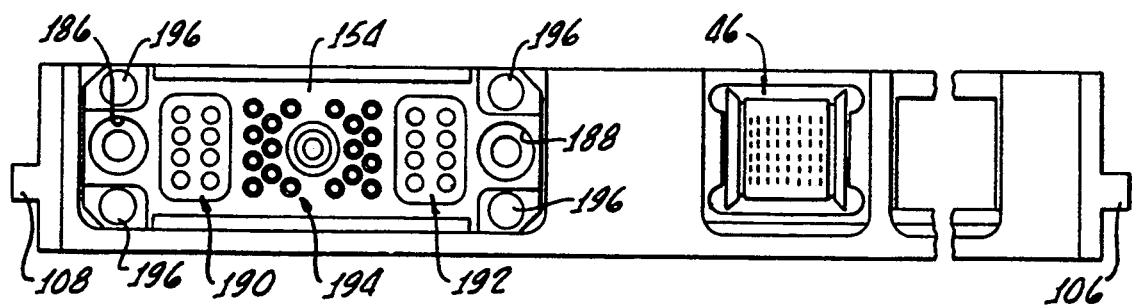
FIG. 6 is a view of a portion of the front of the connector node carrier secured to an edge of one circuit board.
Figure 14:
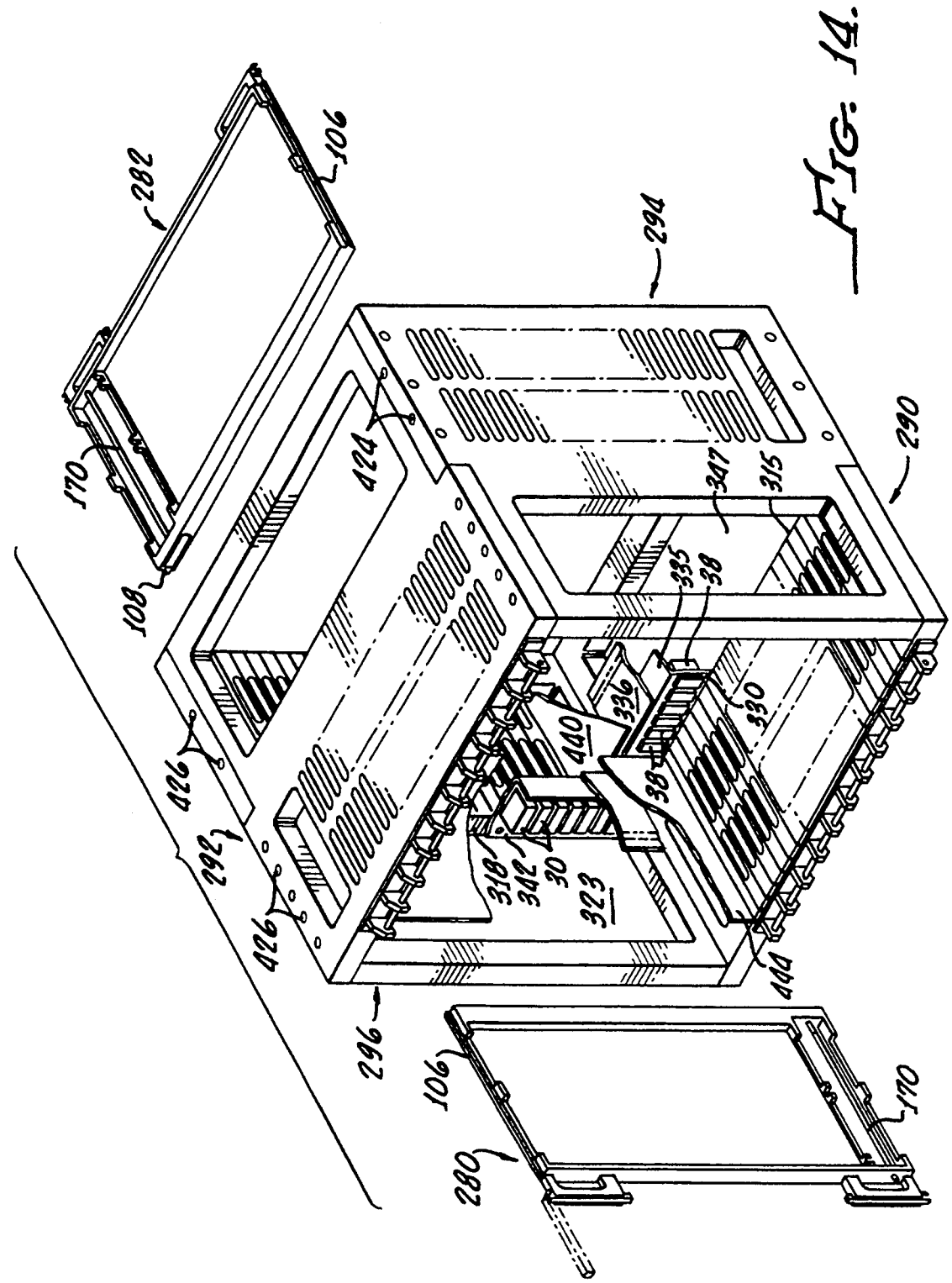
FIG. 14 is a pictorial view, with printed circuit board frame module assemblies exploded, of a frame module assembly mounting cage, employing principles of the present invention, for carrying stacks of boards connected in edge to edge relation.
Figure 17:
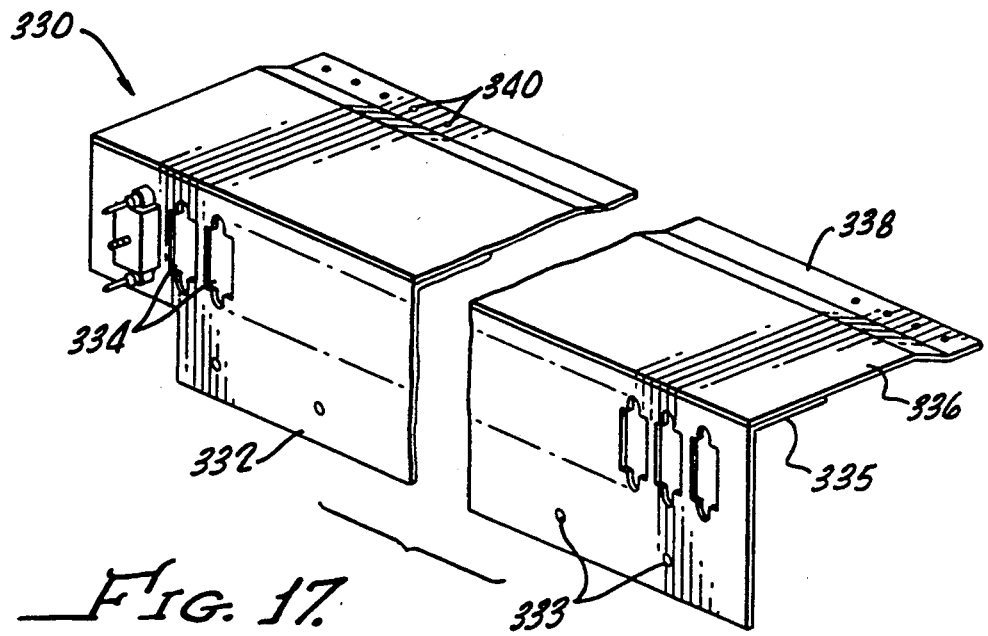
FIG. 17 is a pictorial view of a mid-plane terminating panel showing its array of service cable connector part mounting pockets.
Figure 21:
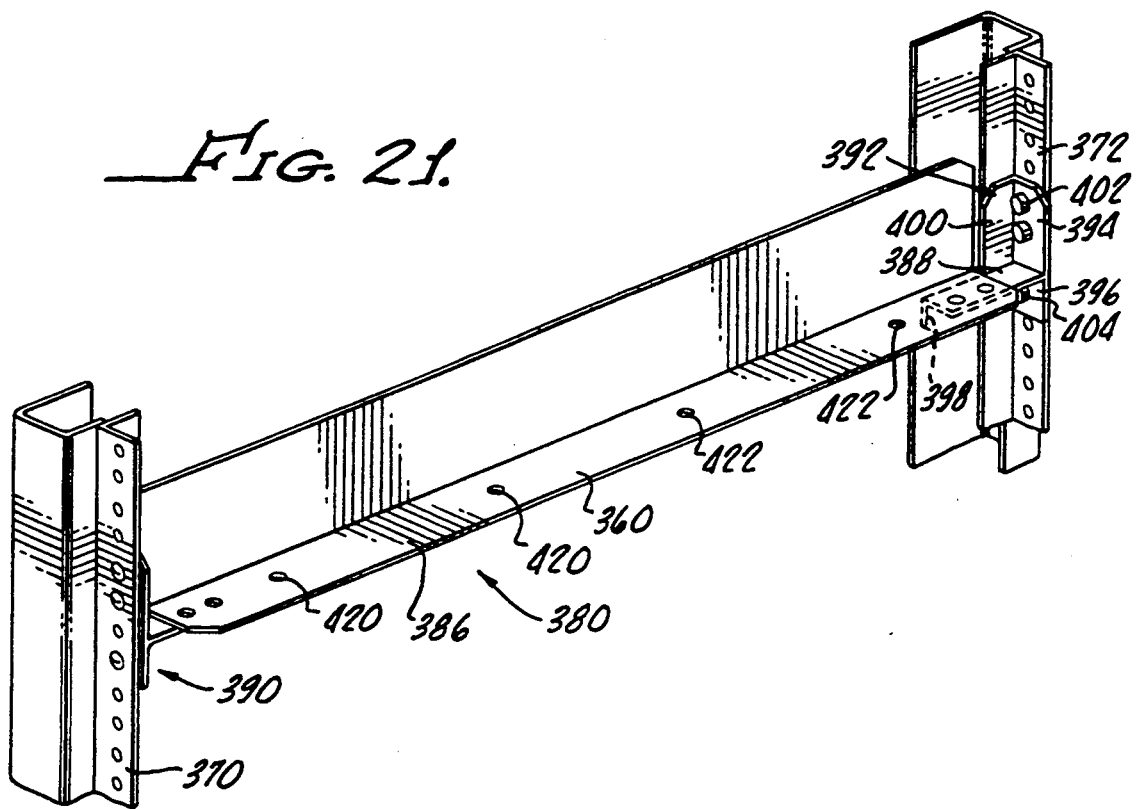
FIG. 21 is a pictorial view illustrating certain details of the cage mounting rack.

Carrier frame 110, at one end thereof, is formed with a service cable end section 150 (FIG. 3) in which is formed an elongated rectangular service cable connector opening 152 that receives a service cable connector plug part 154 (FIGS. 6 and 12). Plug part 154 and the receptacle part 32 with which it mates are described in detail in the above identified application for Sequential Mating of Connectors of Multiple Circuit Board Assembly. As best seen in FIG. 12, service cable connector plug part 154 is fixedly mounted in the connector opening 152 and includes a body 156 having a bore 158 extending therethrough that rotatably receives a necked down end 168 of a jack nut 169 that is resiliently urged axially outwardly by a spring (not shown) and is connected to be rotated by a shaft 170 that extends through the length of the channel guide rail 80. The distal end of shaft 170 is rotatably mounted in the metal face plate 52 and extends therethrough to provide a projecting end 174 (FIG. 5) having a tool receiving configuration that allows the shaft 170 to be rotated. The proximal end 176 of the necked down section 168 of the jack nut 169 is bored and internally threaded, having a circumferential groove that receives a retainer ring 178, to retain the jack nut 169 in the connector plug part. When the plug part is mated to the receptacle part, the bore of end portion 176 detachably and threadedly receives a fixed externally threaded stud 180 that is fixedly mounted in the service cable connector receptacle part 32. The service cable connector receptacle part also includes a plurality of fixed alignment pins 182,184 which are slidably received in alignment apertures 186,188 formed in the service cable connector 156. The connector plug part also includes a number of connection sockets, including socket groups 190,192 (FIG. 6) in which, respectively, are mounted a groups of electrical power cable pins and a socket group 194 in which are mounted fiber optic cable pins. The connector part plug is secured to the carrier housing 110 by means of four bolts, such as bolts 196 (FIG. 6). The side rails, face plate and carrier of the frame are fixedly connected together, as by bolts or the like, to form a rigid frame assembly that securely mounts and circumscribes the printed circuit board. The receptacle part 32 is floatingly mounted as one of an array of like mounted identical receptacle parts carried by the mid-plane terminating panel 330,342 (FIGS. 14,17).

As can be seen in FIG. 5, power cables, generally indicated at 200, are directed as a bundle through the slot 102 in upstanding lug 94 of inner guide rail 78. The power cables then are bent and directed in the guide channel along the channel web 84 for connection to appropriate terminals on the service cable connector plug part 154. Similarly, fiber optic input/output cables, generally indicated at 202 in FIG. 5, are bundled and directed through slot 100 of projection 92 of inner guide rail 78 and then bent to pass within the channel along its web 84 for connection to the appropriate terminals of the service cable connector plug part 154. The fiber optic cables couple optical signals to electrical signal circuits on the printed circuit board by means of optical/electrical converters (not shown) carried on the back of the printed circuit board. Thus, it will be seen that all of the data connections, made via the hermaphroditic edge connector nodes 46, and all of the service cable connections, including connections for the power cables and input/output fiber optic cables, are provided along the same terminating plane of the printed circuit board and frame module assembly.

Figure 10:
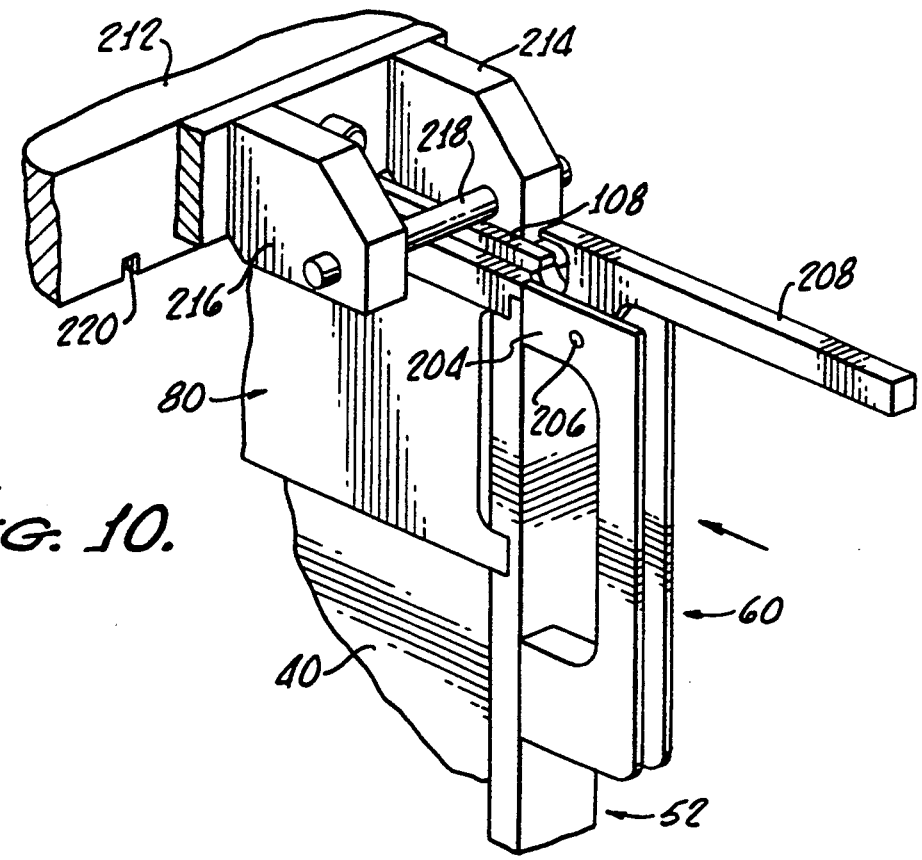
FIG. 10 is a fragmentary pictorial view of a latching cam hook and handle of the frame displaced from a latching rod on a multiple frame module assembly mounting cage.
Figure 11:
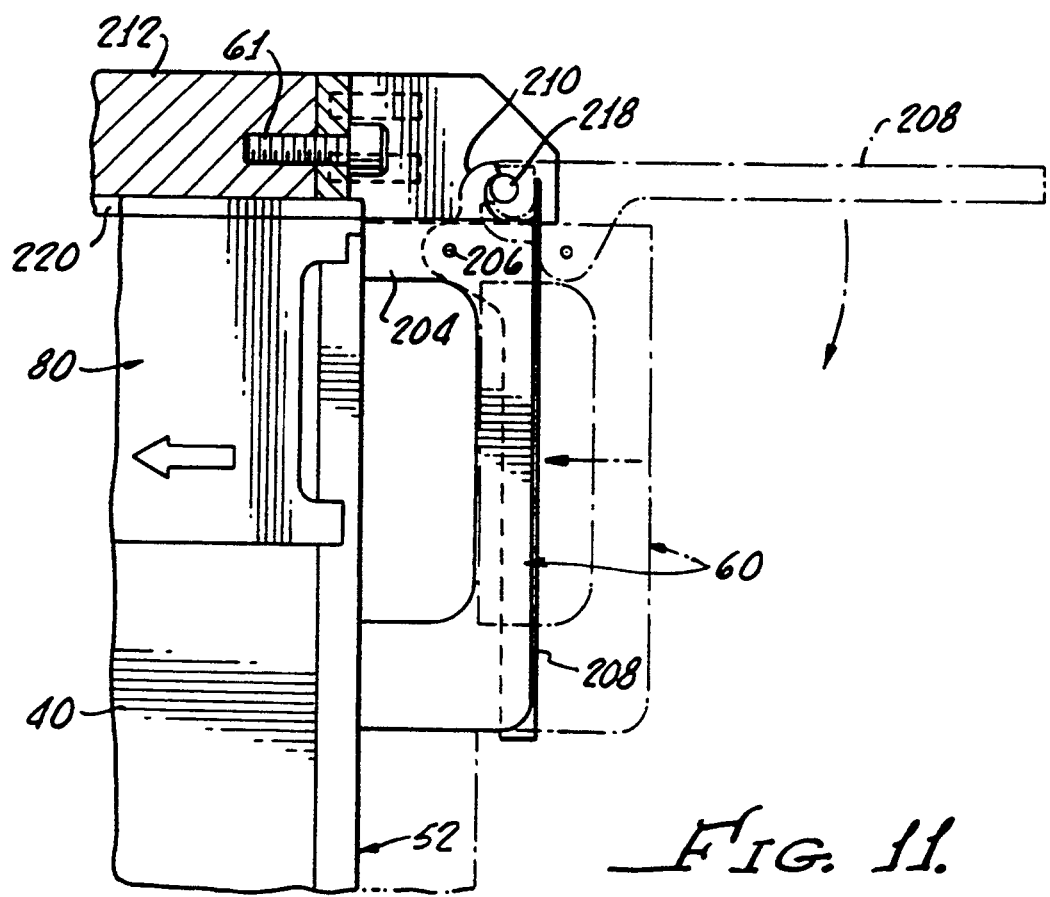
FIG. 11 is a side view of the handle and its latching hook in latched condition.

As can be best seen in FIGS. 10 and 11, the frame module assembly face plate 52, at opposite ends thereof, fixedly carries a pair of identical (but opposite hand) D-shaped handles, such as handle 60, having an end leg 204 in which is pivoted, on a pin 206, an actuating lever 208 having a curved latching hook 210 positioned on the side of the pivot 206 opposite lever 208. The arrangement forms a first class lever to enable the hook 210 and actuating lever 208 to pivot between the open position illustrated in FIG. 10 and the latched position illustrated by solid lines in FIG. 11. Handle 60 is fixedly secured to the face plate 52, as by bolts 61 (FIG. 11). The frame mounting cage assembly (to be described in detail below) includes a panel structure 212 (FIGS. 10 and 11) carrying a plurality of spaced outwardly projecting latch rod support brackets 214,216, etc., forming circuit board frame module assembly receiving channels therebetween. Cage panel 212 is formed with a plurality of guide grooves 220 that receive the guide ribs, such as ribs 106 or 108 on one side of a frame module assembly guide rail. Brackets 214,216 and the other brackets (not shown in FIG. 10) of the cage panel 212, all mount a fixed latch rod 218 extending along the edge of the cage panel 212, through all of the brackets, in a direction perpendicular to the plane of the printed circuit board and frame module assemblies that are to be latched thereto. Rod 218 is positioned to be engaged by the latching hooks 210 of the two handle levers of each individual frame module assembly when the circuit board frame module assembly has been properly positioned within the mounting cage.

To secure each individual assembly of printed circuit board and its frame module in the mounting cage, the frame is guided into the cage with its guiding ribs slidably received in the grooves 220 of the cage panels while the levers 208 of both handles are in the unlatched position illustrated in FIG. 10. When the printed circuit board and frame module assembly has reached the limit of it manual insertion position, the hook is just below the rod 218, as shown in phantom lines in FIG. 11, and the rod is contacted by the open hook. Data contacts on the hermaphroditic nodes are now about 1/16 to ⅛ inch from their final latched position. The guide pins and shielding flanges (not shown) of the service cable connector parts are just party engaged, and the screw 180 and nut 168 are in end to end abutment, but electrical power and fiber optic pins are not engaged when the nodes are in this position. Lever 208 then is turned in a clockwise direction, as viewed in FIG. 11, to cause the latching hook 210 to engage and firmly lock onto the rod 218, pulling the frame module assembly another 1/16 to ⅛ inch into it final position. The lever of the other handle of the frame assembly is also operated, in the same manner, to latch the other end of the frame module assembly. The shaft 170 is rotated to threadedly engage bolt 180 (FIG. 12) within the threaded bore of the jack nut to tighten the interconnection of connector plug part 154 to connector receptacle part 32 and effect engagement of the connector plug and receptacle pins. Further detail of this engagement is described in the above identified patent application for Sequential Mating of Connectors of Multiple Circuit Board Assembly.

Having described the individual printed circuit board and frame module assemblies, the cage for mounting stacks of edge to edge interconnected printed circuit board frame module assemblies will now be described.

MOUNTING CAGE

Figure 15:
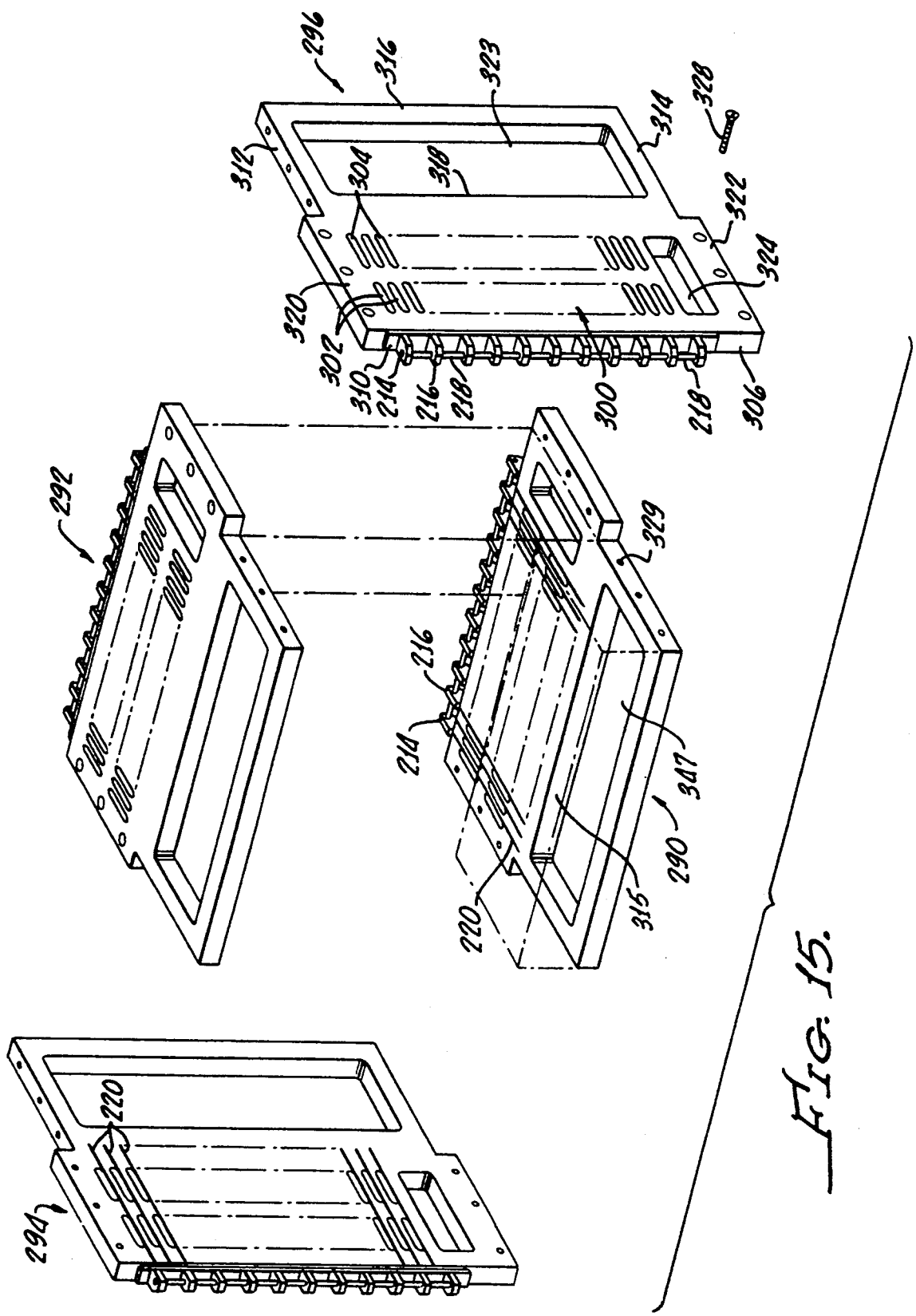
FIG. 15 is an exploded view showing the four panels forming the mounting cage.

To mount an assembly of two stacks of edge connected printed circuit board frame module assemblies and to hold the boards of each stack in stable operative position and configuration, according to principles of the present invention, there is provided a four sided mounting cage assembly, as depicted in FIG. 14. The mounting cage assembly illustrated in FIG. 14 allows for insertion and positioning of a first stack, such as a vertically oriented stack 280 (only one board and frame assembly of the stack is illustrated), of a plurality of printed circuit board and frame module assemblies, and a second stack 282 of a similar plurality of printed circuit board and frame module assemblies, which are horizontally oriented. The board and frame assemblies of the first stack are all to be securely mounted in the cage and interconnected with the board and frame assemblies of the second stack, also securely mounted in the cage, and the service cable connector plug of each is connected to one of the service cable receptacle parts floatingly mounted in the cage. The assembled configuration of two stacks of board and frame assemblies, without the supporting cage, is shown in FIG. 2. The cage with stacks detached therefrom is shown in FIG. 14. The cage is basically a four sided cubical box, fully open at both front and rear. It is made of four nearly identical and hermaphroditic panels, including a bottom panel 290, a top panel 292, a right side panel 294 and a left side panel 296. The several panels form front and rear openings and, although the cage actually has neither front nor back, the opening closer to the viewer in FIG. 14 is termed herein the front, and the other is termed rear, for convenience of description. In FIG. 15, the cage is turned around so that the opening closer to the viewer is the rear opening. The two side panels 294,296 are substantially identical to each other except that they are of opposite hand with respect to outwardly directed and inwardly directed surfaces. Similarly, the top and bottom panels 292,290 are substantially identical to each other, except for the opposite handedness due to the outer surface of panel 292 facing upwardly and the outer surface of panel 290 facing downwardly. Further, certain minor variations are present in the position of various bolt holes for assembly purposes. Nevertheless, the panels are sufficiently identical so that a description of one (right side panel 294) should suffice to describe each of the others.

Each panel is formed of a thick plate of a suitable rigid metal, such as aluminum, having a main body section 300 through which are formed first and second parallel rows of cooling air flow apertures 302,304 etc. extending entirely through the main body section to provide for air flow. A first panel edge 306 (at the rear of the panel, for right side panel 294) at one side of main body section 300 fixedly mounts the plurality of spaced brackets 214, 216, etc., extending vertically (for the side panels) along nearly the full length of the panel edge and supporting the locking rod 218. All of the brackets are fixedly mounted to an elongated plate 310, which itself is fixedly mounted to the panel edge 306. Main body section 300 adjoins an access window section formed by integral end arms 312,314, which are interconnected at outer ends thereof by a side arm 316, which is at the front of the right side panel. Arms 312,314,316 cooperate with an inner edge 318 of the main body section 300 to define a large access window 323. The length of the main body section, in a direction parallel to the longitudinal extent of rod 218, is greater than the length of the window section, effectively providing rabbitted or recessed portions along the first and second window section arms 312,314, and providing outwardly extending edge flanges 320,322 on the main body section.

The several panels are assembled to one another in the rigid cubical arrangement shown in FIG. 14 with the edge flanges 320,322 of one panel being received in the recessed or rabbitted portions of the window sections of adjacent panels on either side. Suitable bolts 328 (FIG. 15) are provided, extending through the flanges 320,322 of one panel into threaded apertures 329 of the window section arms of the adjacent panels. An elongated service cable access window 324 is provided in one end of the main body section 300, adjacent an end of the rows of air flow apertures 302,304, being elongated in a direction perpendicular to the extent of the latch rod 218 and perpendicular to the elongated extent of the elongated window 32.

As can be best seen with respect to panels 290 and 296 in FIG. 15, the inner surface of the main body section of each panel is provided with a plurality of mutually spaced, parallel grooves 220, there being two grooves for each individual space between a pair of brackets 216,218. The grooves extend from the edge of the main body section to an inner intermediate portion thereof close to the large window 323.

Fixedly mounted to the window forming edge 315 of bottom panel 290 is an upstanding mid-plane terminating panel 330 (FIGS. 14, 17), including a lower mounting section 332 having a plurality of apertures 333 that receive bolts that fixedly connect the mid-plane terminating panel 330 to the inner edge 315 of the main body section of panel 290. The panel 330 extends horizontally substantially across the length of the window of panel 290 and is formed with a linear array of connector receptacle mounting pockets 334 in which are loosely mounted a plurality of connector receptacle parts, such as shown at 38 in FIGS. 2, 12 and 14. The panel 330 includes an inwardly directed angled flange 334 to which is fixedly secured a sheet 336 having an edge portion 338 in which is formed a plurality of holes 340 for use in securing wire and cable tie straps (FIG. 17).

In an arrangement that is the same as that described for bottom panel 290, left side panel 296 also carries a vertically extending mid-plane terminating panel 342 identical to panel 330, bolted to windowing forming edge 318 and loosely mounting a linear array of service cable connector receptacle parts 30 (see also FIG. 2).

The array of cable connector receptacle parts on panel 330 extends horizontally (as viewed in FIG. 14) along the window edge of bottom panel 290 and each receptacle part is configured and arranged to cooperate with the single service connector plug, such as plug 154 of FIGS. 6 and 12, of a single printed circuit board frame module assembly, for connecting electrical power and input/output fiber optic cables from the associated printed circuit board to the various cables (not shown) that are connected to the individual service connector receptacle parts and which are accessible through the service windows, such as windows 323 (connector parts 30) and 347 (connector parts 38). Each mid-plane terminating panel 330 and 342, together with its array of loosely mounted service cable connector parts (38,30) and, also, the various electrical power and fiber optic cables connected thereto are mounted to and removable from a cage, as a unit, for servicing of these parts. For example, vertical panel 342 (FIG. 14) and its connector parts 30 are readily removed as a single unit, by removing bolts that attach the mid-plane terminating panel to the edge 318 of cage side panel 296. The entire unitary module of panel 342 and all connectors parts 30 is then tilted and otherwise maneuvered to enable the module to be moved longitudinally out of the cage through the window 323 of cage side panel 296. Installation of the unitary module 342,30 is accomplished by reverse motions. The unitary module of mid-plane terminating panel 330 and all of its connector parts 38 is removable from and attachable to the edge 315 of bottom cage panel 290 via the window 347.

Figure 16:
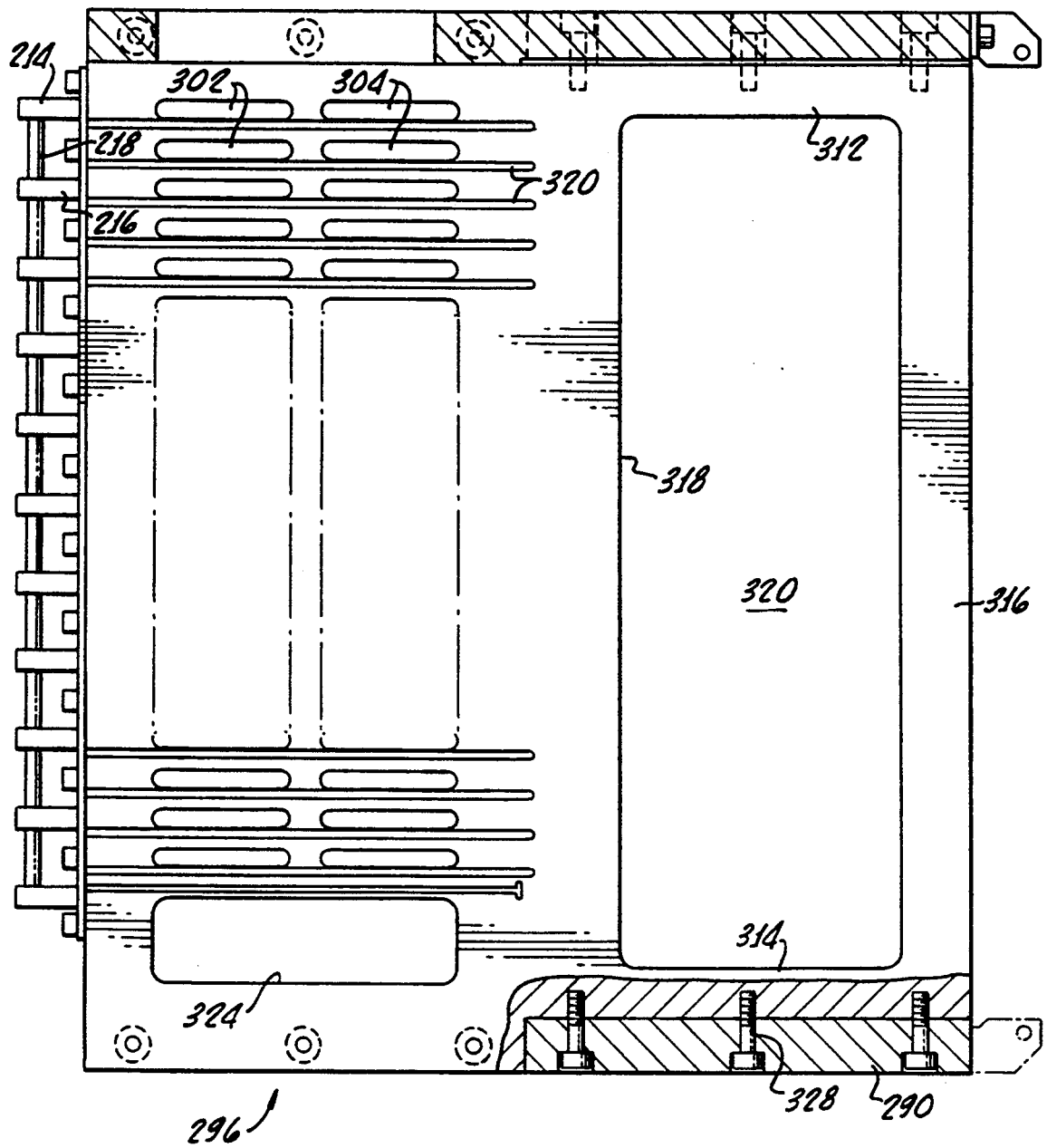
FIG. 16 is a side view, partly in section, of the mounting cage.
Figure 19:
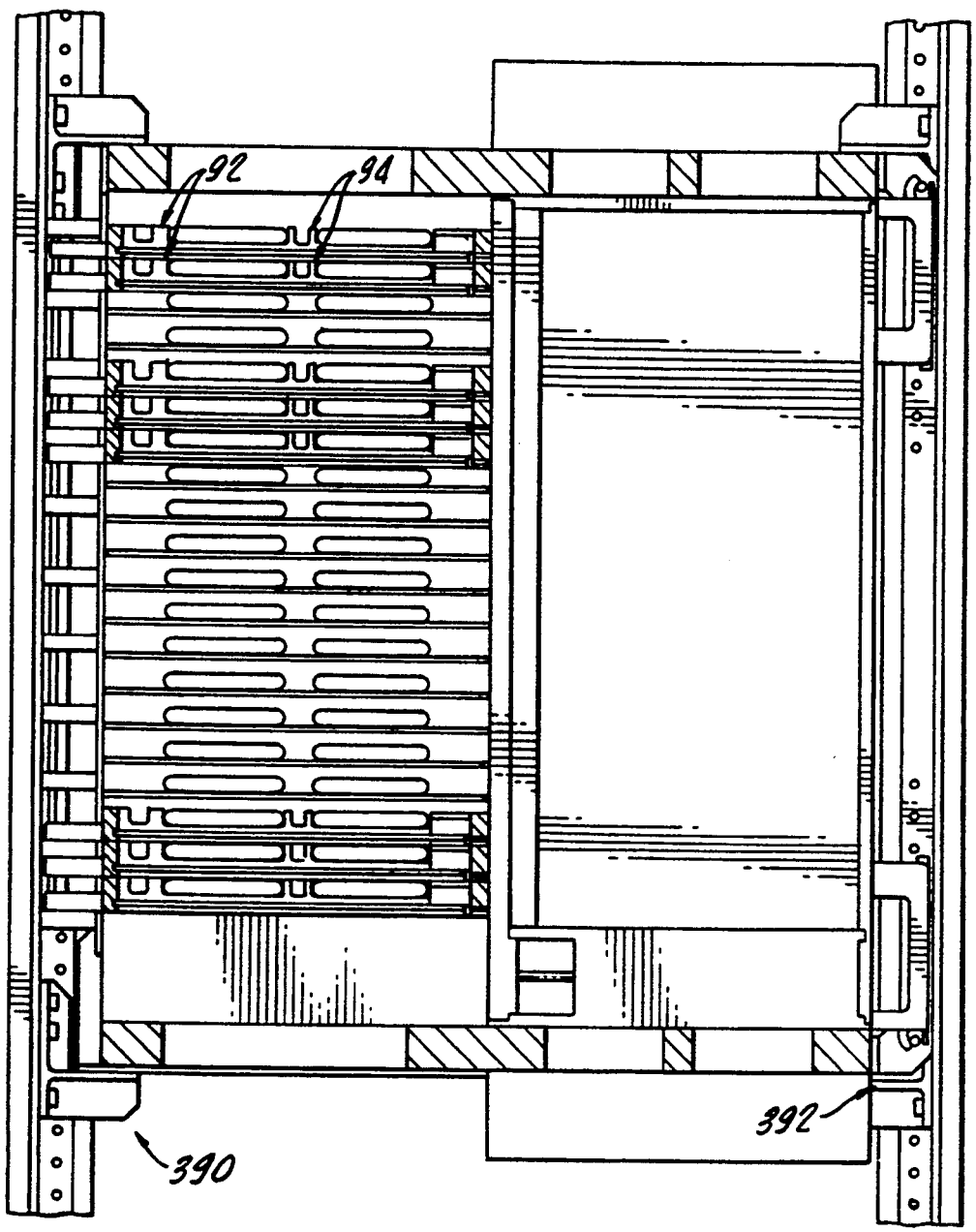
FIG. 19 is a fragmentary side elevation of a mounting cage and printed circuit board frame module assemblies in a mounting rack.

The rigid mounting cage shown in FIGS. 14 and 16 and in exploded view in FIG. 15 may be mounted in any one of a number of arrangements, such as on a tabletop, for example, or in an upright rack assembly, as shown in FIGS. 18,19 and 20, for example. FIG. 18 shows such an upright mounting rack assembly, without auxiliary equipment mounted thereon. The rack assembly comprises a rigid upper rectangular frame structure 350 and a rigid lower frame structure 360 adapted to rest on a floor or other suitable support. The upper and lower frame structures are rigidly interconnected by vertically extending corner posts 362,364,366 and 368. To each post is rigidly secured, as by welding, a vertically extending elongated angle mounting member 370,372,374,376 having an angle cross-section and having a plurality of mounting holes spaced along its length. Right and left horizontally disposed cage support rails of L-shaped cross-section 380,382 are fixedly mounted by rail mounting brackets, such as brackets 390,392, at the ends thereof to respective ones of the mounting members 370,372 and 374,376. The support rails are identical, and, for rail 380, for example, the horizontal leg 386 of the rail rests upon and is bolted to a horizontal leg 388 (FIG. 21) of each of a pair of the rail end mounting brackets 390,392. Each bracket has a vertical leg integrally formed with the horizontal leg 388, with each vertical leg having an upper portion 394 and a lower portion 396 extending below the horizontal leg 388. Additional horizontal and vertical strengthening flanges 398 and 400 are integrally formed and interconnected with bracket legs 388, 394 and 396. The brackets are bolted to the angle mounting members 370,372 by bolts, such as 402, extending through the bracket sections 394,396 into apertures in threaded holes in the angle mounting member 372. Horizontal leg 386 of the rail 380 is formed with a plurality of apertures, such as apertures 420 and 422, which receive bolts that extend into blind threaded fastening apertures on appropriate portions of the side edges of the outside of the cage panels 290,292,294 and 296.

A similar pair of rails and end brackets are secured to the angle mounting members 370,372 above the cage, and, if desired, may be bolted to blind holes, such as holes 424,426 (FIG. 14) in side edges of the cage panels.

The assembled cage is installed in the frame by sliding it in from the right or left side of the frame, passing over one of the lower support rails 380,382, to be supported on the horizontal flanges of the lower pair of rails 380,382, after which the upper pair of rails may be installed.

The assembled cage provides two pairs of opposed mutually facing mutually parallel spaced grooved panel sides, with the guideway grooves 220 in the bottom panel 290 being mutually parallel and mutually spaced, facing inwardly and upwardly. These guideway grooves also face and are respectively aligned with corresponding grooves on the inside of the top panel 292. Similarly, the guideway grooves in the left side panel are facing and are aligned with corresponding guideway grooves of the right side panel. Thus a vertically oriented circuit board frame module assembly 280 may be positioned, as indicated in FIG. 14, and slidably guided into position within the cage, from the open front of the cage, by engaging its guide ribs 106,108 in corresponding inwardly facing guideway grooves of the top and bottom panels 292,290. In a like manner, a horizontally oriented frame and printed circuit board assembly 282 is slidably inserted through the open rear side of the cage by engaging its guide ribs 106,108 in the guideway grooves of the right and left side panels 290,296.

Each frame and printed circuit board assembly of the stack 280 is slid separately and independently into the cage through the front opening between bottom and top panels 290 and 292. Each assembly of the stack 282 is slid into the cage through the rear opening between side panels 294 and 296. Each printed circuit board frame module assembly is slidably inserted until the latching hook 210 of the cam lever handles is in a position to grasp the latching rod 218 when the lever 208 is rotated. The levers of both cam handles are rotated from the open position illustrated in FIG. 10 to the closed position illustrated in FIG. 11 to pull the circuit board and frame module assembly a final distance into the mating guideway grooves of a pair of oppositely disposed cage panels. This final lever actuated motion positions the data connecting hermaphroditic nodes 46 in the mid-plane of the cage and, at the same time, causes an initial mating engagement of alignment pins, shielding flanges, and the screw and nut fasteners (abutting but not threadedly engaged) of the service connector plug and receptacle parts 154,38. The connection between plug 154 and receptacle 38 is then tightened by rotation of the shaft 170 to attain the plug and receptacle fully mated positions shown in FIG. 12. This operation is repeated for each of the circuit board and frame module assemblies of the vertically oriented (as viewed in FIG. 14) stack 280, and is then repeated for each of the printed circuit board and frame module assemblies of the horizontally oriented stack 282. Just as with the vertically oriented panels of the stack 280, the handle levers of the horizontally oriented stack 282 are moved from open position, in which the boards are inserted, to the closed position to pull the boards into their final operative position. As previously described, this causes the hermaphroditic connector nodes 46 of each board to physically and electrically contact the corresponding connector nodes of the boards of the other stack, as illustrated in FIG. 12. As with the other stack, the rods 170 of the horizontally oriented printed circuit board and frame module assemblies are rotated to tighten the interconnection between the service cable connector plug part of the horizontally oriented printed circuit board frame module assemblies and the service cable connector receptacle parts that are floatingly mounted in the vertically extending mid-plane terminating panel 342.

As best seen in FIG. 20, a fan housing, such as housing 450, is mounted to the outside of at least one of the cage side panels to cover the arrays of elongated ventilation openings formed in the main body sections of at least one of the pair of side panels. A similar fan housing (not shown) is mounted to cover ventilation openings of at least one panel of the top and bottom panels. An array of fans is mounted in each fan housing to force flow of cooling air over and between panels of each stack.

With a stack of printed circuit boards mounted adjacent to one another, as can be seen in FIGS. 2 and 19, the upstanding projections 68,70,74, 92,94,96 and 86,88,90 cooperate with the one side of the circuit board to which their guide rails are connected, and with the back side of the adjacent circuit board to provide substantially unobstructed air flow passages. Each such air flow passage is aligned with an air flow opening of the aperture rows 302,304 in the cage panels on either end of the stack of printed circuit board and frame module assemblies. Thus the fan assembly can readily blow cooling air through the support panels of the cage and through the air passages provided by the printed circuit board frame configuration.

Further, the U-shaped channel rails of one board cooperate with the back side of an adjacent board to form a nearly closed box that almost completely confines the service cables to protect these cables and to electrically shield circuits on the board from the signals carried by the electrical power cables.

A fixed horizontally extending isolation, electrical shield and deflector panel assembly 440 is mounted adjacent the horizontal mid-plane terminating panel 330, and a similar vertically extending isolation, electrical shield and deflector panel assembly 444 is mounted adjacent the vertical mid-plane panel assembly 342 to complete the confinement of air flow and to provide electrical shielding and isolation of the circuit boards from the service cables.

What is claimed is:

1. A mounting cage for supporting a plurality of circuit boards comprising:
    first and second pairs of mutually parallel and mutually spaced support panels having front and rear edges,
    panels of each of said pairs extending between and fixedly interconnecting panels of the other of said pairs to define a rigid cage having a front opening framed by front edges of panels of said pairs and a rear opening framed by rear edges of said pairs,
    panels of each of said pairs each including circuit board receiving guideways with guideways of each pair forming mutually opposed and aligned pairs of guideways, each pair of said guideways being configured and arranged to receive opposite edges of a circuit board, and
    the guideways of said first pair of panels extending from said front edges toward said rear edges, the guideways of said second pair of panels extending from said rear edges thereof toward said front edges, whereby a first group of circuit boards may be slidably inserted into said cage through said front opening, and wherein a second group of circuit boards may be slidably inserted into said cage through said rear opening.

2. The mounting cage of claim 1 wherein the panels of at least one of said pairs include rows of air flow apertures extending therethrough, said rows extending transversely of said guideways.

3. The mounting cage of claim 2 including a first pair of latch rods fixed to and spaced from the front edges of the panels of said first pair, each said latch rod extending along such front edge, and a second pair of latch rods fixed to and spaced from the rear edges of the panels of said second pair, each latch rod of said second pair of latch rods extending along such rear edges.

4. The mounting cage of claim 1 wherein the guideways of the panels of said first pair extend to an inner intermediate portion of said panels, and including a mid-plane terminating panel fixed to one support panel of said first pair of panels and extending transversely of inner parts of said guideways of said one support panel.

5. The mounting cage of claim 4 wherein the guideways of the panels of said second pair extend to an inner intermediate portion of the panels of said second pair, and including a second mid-plane terminating panel fixed to one end of said second pair of panels and extending transversely of inner parts of said guideways of said second pair of panels.

6. The mounting cage of claim 4 including a plurality of cable connector sockets in said mid-plane terminating panel, and including a cage access window formed in one panel of said second pair adjacent said mid-plane terminating panel.

7. A mounting cage for mounting stacks of printed circuit boards having longitudinally extending projecting guide ribs on opposite edges thereof, said mounting cage comprising:
    first and second mutually spaced and mutually parallel support panels, each panel including a plurality of mutually spaced and mutually parallel guide grooves for slidably receiving an individual one of said guide ribs of circuit boards to be mounted thereon and positioned in planes perpendicular to said panels,
    third and fourth mutually spaced and mutually parallel support panels fixedly connected to said first and second support panels to form a mounting cage having an open front and an open rear, each of said third and fourth support panels being perpendicular to said first and second panels and including a plurality of mutually spaced and mutually parallel guide grooves adapted to slidably receive guide ribs of circuit boards positioned in planes parallel to said first and second panels, whereby a first group of mutually parallel closely spaced circuit boards is adapted to be slidably received in the grooves of said first pair of panels, and a second group of closely spaced mutually parallel circuit boards positioned in planes perpendicular to the planes of the circuit boards of said first group is adapted to be slidably received in the grooves of said third and fourth panels, the grooves of said first and second panels extending from a front edge of said first and second panels to an intermediate portion thereof, the grooves of said third and fourth panels extending from a rear edge thereof to an intermediate portion thereof.

8. The mounting cage of claim 7 including a mid-plane termination panel fixed to said first support panel and upstanding therefrom, a first service cable connector part carried by said mid-plane termination panel, a second mid-plane termination panel fixed to said third panel and upstanding therefrom, and a second service cable connector part carried by said second mid-plane termination panel.

9. The cage of claim 7 wherein each of said first and second support panels has a main body section, first and second parallel rows of cooling air flow apertures extending through said main body section to provide for air flow, and an access window in said main body section adjacent an end of said rows of apertures.

10. The mounting cage of claim 9 wherein each of said support panels includes outwardly extending edge flanges on the main body section defining recessed portions on adjacent sections of the panel, the edge flanges of said first and second support panels being received in recessed portions of the third and fourth support panels, and the edge flanges of the third and fourth support panels being received in recessed portions of the first and second support panels.

11. The mounting cage of claim 10 including means for blowing air through said apertures of said rows of apertures.

12. A mounting cage for mounting stacks of circuit boards that are to be connected to one another in edge to edge relation, said cage having a front and rear and comprising:

first, second, third and fourth rigid support panels connected together in mutually spaced pairs to form a rectangular cage open at said front and rear of said cage, each said panel comprising:

a main body section and a window section, said main body section having an inner surface and extending laterally to form first and second lateral flanges and defining recesses along sides of said window section, the flanges of said first and fourth rigid support panels being received in recesses of said second and third rigid support panels, the flanges of said second and third rigid support panels being received in the recesses of said first and fourth rigid support panels, a row of apertures extending through said main body section from one of the flanges of said main body section toward the other, a cable access window formed in said main body section adjacent one end of said row of apertures, a row of mutually spaced and mutually parallel guide grooves formed in an inner surface of said main body section, and a locking rod fixed to and extending in spaced relation along an edge of said main body section, a first mid-plane terminating panel fixed to said first rigid support panel adjacent an end of the guide grooves thereof, said guide grooves terminating at an inner intermediate portion of said first rigid support panel, and a second mid-plane terminating panel fixed to an intermediate portion of said third rigid support panel adjacent an end of the guide grooves thereof, the guide grooves of said third rigid support panel terminating at ends positioned at an intermediate inner portion of said third rigid support panel, and cable sockets mounted in said first and second mid-plane terminating panels.

* * * * *